United States Patent [19]

Fukuda

[11] Patent Number: 4,741,000
[45] Date of Patent: Apr. 26, 1988

[54] PHOTOELECTRONIC SWITCH
[75] Inventor: Masahiko Fukuda, Suita, Japan
[73] Assignee: Keyence Co., Ltd., Osaka, Japan
[21] Appl. No.: 878,082
[22] Filed: Jun. 24, 1986
[30] Foreign Application Priority Data Jun. 26, 1985 [JP] Japan .................................. 60-139542

[51] Int. Cl.[4] .......................... H03K 19/14; G01V 9/04
[52] U.S. Cl. ......................................... 377/20; 377/16; 377/31
[58] Field of Search ..................... 377/20, 30, 31, 15, 377/16

[56] References Cited

U.S. PATENT DOCUMENTS

| | | | |
|---|---|---|---|
| 3,792,241 | 2/1974 | Sullivan | 377/30 |
| 4,142,238 | 2/1979 | Brandt et al. | 377/20 |
| 4,580,295 | 4/1986 | Richman | 377/20 |
| 4,628,521 | 12/1986 | Nishimura et al. | 377/30 |

FOREIGN PATENT DOCUMENTS 52-82066  7/1977  Japan .
61-139776  6/1986  Japan .

Primary Examiner—John S. Heyman
Attorney, Agent, or Firm—Armstrong, Nikaido, Marmelstein & Kubovcik

[57] ABSTRACT

A photoelectronic switch circuit of a pulse-modulated light system adapted to emit pulse light and conduct detecting operation by detecting only the photo-reception signal synchronized with the pulse light, and it comprises a counter control circuit for resetting or presetting the output signal from a counter if the number of pulse light successively received is less than a predetermined number to eliminate the effect, if any, of external disturbance light and facilitates to attain the integrated circuit by reducing the number of parts for the circuit constituting portion.

7 Claims, 14 Drawing Sheets

PHOTOELECTRONIC SWITCH

BACKGROUND OF THE INVENTION

1. Field of the invention

This invention concerns a photoelectronic switch of a pulse-modulated light system, that is, a photoelectronic switch adapted to project pulse light and conduct the detecting operation by detecting only the photo-reception signal synchronized with the pulse light and, particularly, it relates to a photoelectronic switch which is less sensitive to the effects of external disturbances such as electric noises from power supply lines and pulse light from light sources, for example, fluorescent lamps, or from other photoelectronic switches emitting pulse light of similar periods.

2. Description of the prior art

The photoelectronic switch described above has been adapted to input a photo-reception signal transmitted from a photoreceiving device into an integrating circuit, compare the thus obtained integrated value with a predetermined reference value and output a detection signal only when the former exceeds the reference value for reducing the effect of the external disturbances.

However, reactance elements such as capacitors or coils have usually been required for constituting the integrating circuit. Accordingly, it has been difficult to make the circuit portion of the photoelectronic switch smaller and, particularly, to attain an integrated circuit having a reactance with an extremely small capacitance.

Further, since the time constant of the integrating circuit is determined with resistors and capacitors or with resistors and coils, the time of generating the detection signal has been varied due to the scatterings in the characteristics of the parts and, accordingly, the operation response time of the photoelectronic switch has not been uniform.

In order to overcome the above-mentioned problems, Japanese Patent Laid Open No.Sho 52-820665 discloses a tecnique of counting pulses by utilizing a shift register However, although the tecnique can attain the integrated circuit structure since the integrating circuit can be constituted without using the reactance element, it requires flip-flop circuits by the setting number of countings. Accordingly, it results in additional problem of increase in the number of parts and corresponding increase in the post, as well as loss of the advantage for attaining the integrated circuit structure due to the enlargement of the area for the integrated circuit itself.

In view of the above, the applicant of the present invention has already filed Japanese Patent Application No. Sho 59-262198 for overcoming the foregoing problems.

Explanation will now be made of the photoelectronic switch according to the above Japanese Patent Application.

As shown in FIG. 9, a pulse oscillator 1 for oscillating pulses at a predetermined frequency is connected with a light emitting element drive circuit 3 for driving a light emitting element 2 in this photoelectronic switch. The photo-reception signal generated from the photoreceiving element 4 upon receiving the pulse light irradiated from the light emitting element 2 is amplified in an amplifier circuit 5 and then transmitted to a waveform shaping circuit 60. The photo-reception signal n wave form-shaped in the wave form shaping circuit 60 is transmitted to a latch circuit 7. The latch circuit 7 latches the photoreception signal n transmitted from the wave form shaping circuit 60 in synchronization with the oscillation pulses a from the pulse oscillator 1.

Further, the pulse oscillator 1 is connected with a presettable up/down counter 33 for counting the oscillation pulses a from the pulse oscillator 1. The output signals s, t, u from the counter 33 are transmitted to a primary logic circuit 34. The primary logic circuit 34 transmits output signals v, w to a detection output circuit 8 when the counter 33 counts pulses of more than a predetermined number.

Output signals c, p from the latch circuit 7 and the output signals v, w from the primary logic circuit 34 are transmitted to a secondary logic circuit 39. The secondary logic circuit 39 resets the counter output of the counter 33 if the pulse light received continuously at the photoreceiving element 4 is less than the predetermined number. Further, it presets the counted output of the counter 33 if the number of pulse light not received continuously is less than the predetermined number.

Then, explanations will be made to one embodiment of a specific circuit of the photoelectronic with as described above while referring to FIG. 10. Explanations for the light emitting element drive circuit 3, light emitting element 2, photoreceiving element 4, amplifier circuit 5 and detection output circuit 8 are omitted since they are not required for explanating the operation.

The latch circuit 7 that latches the photo-reception signal n produced from the photoreceiving element 4 upon receiving the pulse light and wave form-shaped in the wave form shaping circuit 60 by the oscillation pulses a from the pulse oscillator 1 is constituted with a D-flip-flop (delayed flip-flop). The presettable up/down counter 33 for counting the oscillation pulses a from the pulse oscillator 1 comprises three D-flip-flops 331, 332, 333 connected in series to constitute a 8-step counter.

The primary logic circuit 34 transmitted with the count output signals s, t, u from the counter 33 comprises a first logic circuit 341, a second logic circuit 342 and a flip-flop 343 transmitted with the output signals from both of the logic circuits 341, 342. As described above, the output signals v, w of the flip-flop 343 are transmitted to the detection output circuit 8(not illustrated) as described above. Further, output signals v, w of the flip-flop 343 are fed back to the presettable up/down counter 33. Accordingly, the counter 33 functions as an up or down counter. That is, it functions as a down counter when the Q output signal v from the flip-flop 343 is at a high(hereinafter referred to as "H") level, while it functions as an up counter if the Q output signal v is at a low(hereinafter referred to as "L") level.

In the primary logic circuit 34, the primary logic circuit 341 comprises a NOR circuit 35 transmitted with the $\overline{Q}$ output signal from the flip-flop 331 and the $\overline{Q}$ output signal from the flip-flop 332 and a NAND circuit 36 transmitted with the output signal from the NOR circuit 35 and the Q output signal u from the flip-flop 333. Then, the secondary logic circuit 342 comprises a NOR circuit 37 transmitted with Q output signal s from the flip-flop 331 and the Q output signal t from the flip-flop 332 and a NAND circuit 38 transmitted with the output signal from the NOR circuit 37 and the $\overline{Q}$ output signal from the flip-flop 333.

In the primary logic circuit 34 having such a constitution, the primary logic circuit 341 outputs a signal at "L" level when all of the Q output signals s, t, u from the flip-flops 331, 332, 333 are at "H" level. While on the other hand, the secondary logic circuit 342 outputs a signal at "L" level in the state where all of the signals s, t, u are at "L" level. Accordingly, the Q output signal v of the flip-flop 343 turns from "L" to "H" level when all of the Q output signals s, t, u are at "H" level. Further, it turns from "H" to "L" level when all of the Q output signals s, t, u of the flip-flops 331, 332, 333 are at "L" level.

While on the other hand, the secondary logic circuit 39 comprises a first NOR circuit 391 and a second NOR circuit 392. The first NOR circuit 391 is transmitted with the output signal o from the latch circuit 7 and the $\overline{Q}$ output signal w of the flip-flop 343. Then, the output signal r of the first NOR circuit 391 is transmitted to each of the preset terminals(PR) of the flip-flops 331, 332, 333 for the presettable up/down counter 33. Further, the second NOR circuit 392 is transmitted with the $\overline{Q}$ output signal p of the latch circuit 7 and the Q output signal v of the flip-flop 343. Then, the output signal q of the second NOR circuit 392 is transmitted to each of the clear terminals(CL) of the flip-flops 331, 332 and 333.

The operation of the photoelectronic switch having the circuit of such a constitution will now be described while referring to the operation wave form chart shown in FIGS. 11-14.

At first, the operation of the photoelectronic switch in the state where the photoreceiving element 4 (refer to FIG. 9) does not receive the pulse light is explained as the first case while referring to FIGS. 10 and 11. Alphabetical letters in FIG. 11 correspond to those for the signals in each of the portions of the circuit in FIG. 10.

In the state as described above, no photo-reception signals are generated in the photoreceiving element 4 as shown to the left of n in FIG. 11. Accordingly, the wave form shaping circuit 60 keeps to output signals at "H" level as shown to the left of n in FIG. 11. The flip-flop 343 in the primary logic circuit 34 issues the Q output signal v at "L" level and the $\overline{Q}$ output signal w at "H" level in this state. Accordingly, the first NOR circuit 391 of the secondary logic circuit 39 is inputted with the Q output signal w of the flip-flop 343 and the Q output signal o of the latch circuit 7, which are both at "H" level. Therefore, output signal r takes the "L" level. Further, the second NOR circuit 392 is inputted with the Q output signal v of the flip-flop 343 and the $\overline{Q}$ output signal p of the latch circuit 7, which are both at "L" level. Therefore, the output signal q takes the "H" level.

The output signal r at "L" level from the first NOR circuit 391 is transmitted to each of the preset terminals(PR) of the flip-flops 331, 332, 333. Further, the output signal q at "H" level from the second NOR circuit 392 is transmitted to each of the clear terminals(CL) of the flip-flops 331, 332, 333. Accordingly, since the signal "H" is inputted to the clear terminal(CL) of the presettable up/down counter 33, the counter is forcedly reset. Therefore, all of the Q output signals s, t, u from the flip-flops 331, 332, 333 are at "L" level, while all of the $\overline{Q}$ output signals are at "H" level.

The primary logic circuit 341 in the primary logic circuit 34 inputted with the $\overline{Q}$ output signal("H") of the flip-flop 331 and the $\overline{Q}$ output signal("H") of the frip-flop 332 outputs a signal at "H" level if at least one of the Q output signals s, t, u of the flip-flops 331, 332, 333 is at "L" level. Accordingly, it outputs a signal at "H" level in the state not receiving the pulse light. In the same manner, the secondary logic circuit 342 outputs a signal at "L" level. As a result, the Q output signal v keeps "L" level while the $\overline{Q}$ output signal w keeps "H" level in the flip-flop 343. Both of the output signals are transmitted to the detection output circuit 8 (refer to FIG. 9). Then, the detection output circuit 8 externally transmits the detection output signal indicating that the photoelectronic switch receives no pulse light.

Then, the operation of the photoelectronic switch in the case where successive pulse light is received at the photoreceiving element 4 (refer to FIG. 9) will be explained as the second case also referring to FIGS. 10 and 11.

The light emitting element 4 (refer to FIG. 9) is driven by the light emitting element drive circuit 3 such that it emits pulse light when the oscillation pulses a of the pulse oscillator 1 are at "L" level. The photoreceiving element 4 receiving the pulse light outputs the photoreception signal c. The photo-reception signal c is transmitted to the waveform shaping circuit 60 and waveform-shaped into pulse signals n.

The pulse signals n are inputted to the terminal of the latch circuit 7. While on the other hand, the oscillation pulses a of the pulse oscillator 1 are inputted to the CP terminal of the latch circuit 7. Upon rising of the oscillation pulses a, since the pulse signals n are at "L" level, the latch circuit 7 outputs the signal o at "L" levlel to the Q terminal and the signal p at "H" level to the $\overline{Q}$ terminal respectively. As a result, since the second NOR circuit 392 inputted with the $\overline{Q}$ output signal p of the latch circuit 7 outputs the signal q at "L" level because one of them is at "L" level while the other of them is at "H" level. Upon receiving the signal q at "L" level, the presettable up/down counter 33 is released from the reset state.

The counter 33 released from the reset state starts counting for the oscillation pulses a in synchronization with the oscillation pulses a of the pulse oscillator 1. Accordingly, the Q output signal s of the flip-flop 331 rises from "L" to "H" level. Correspondingly, the output signal from the second logic circuit 342 of the primary logic circuit 34 turnes from "L" to "H" level. At this instance, since the output signal of the first logic circuit 341 is still kept at the state "H", the output signal v(W) of the flip-flop 343 does not turn. As described above, since the Q output signal v(W) of the flip-flop 343 is fed back to the presettable up/down counter 33, the Q output signal v of the flip-flop 343 is at "L" level and, accordingly, the counter 33 functions as an up-counter.

In the course of continuous receiving of the pulse light at the photoreceiving element 4, the counter 33 counts the oscillation pulses a from the pulse oscillator 1. Then, at the instance the seventh shot of oscillation pulses a is inputted to the counter 33, all of the Q output signals s, t, u of the flip-flops 331, 332, 333 are at "H" level. Accordingly, the output signal of the first logic circuit 341 turnes from "H" to "L" level. As described above, since the output signal of the second logic circuit 342 is at "H" level, the output signal of the flip-flop 343 turnes correspondingly to render the Q output signal v to "H" and the $\overline{Q}$ output signal w to "L". Upon receiving the Q output signal v, the detection output circuit 8 externally transmits the detection output signal indicating that the photoelectronic switch has received the pulse light.

Further, at the instance the output signal v of the flip-flop 343 turns, the output signal r of the first NOR circuit 391 turns from "L" to "H" level. Since the signal r at "H" level is inputted to each of the preset terminals (PR) of the flip-flops 331, 332, 333. The presettable up/down counter 33 is forcedly preset. As a result, the Q output signals s, t, u of the flip-flops 331, 332, 333 maintain the "H" level irrespective of the input of the oscillation pulses a from the pulse oscillator 1, hereinafter. Further, since the output signal v(w) of the flip-flop 343 turns, the counter 33 changes from the up counter to the down counter.

Then, the operation of the photoelectronic switch in the case where the photoreceiving element 4 that has so far received the pulse light continuously no more receives the pulse light continuously will be explained referring to FIGS. 10 and 12 as the third case.

When the pulse light is no more received continuously at the photoreceiving element 4, the output signal n of the waveform shaping circuit 60 is kept to "H" level. Accordingly, the Q output signal o turnes to "H" level and the $\overline{Q}$ output signal p turns to "L" level in the latch circuit 7. As a result, since one of the inputs for the first NOR circuit 391 turns to "H" level, the output signal r goes to "L" level. The presettable up/down counter 33 is released from the preset state by the signal r at "L" level.

At this instance, since the output signal v of the flip-flop 343 is at "H" level, the counter 33 has already been switched to the down counter. Therefore, the counter 33 starts downward counting in synchronization with the inputted oscillation pulses a. Simultaneously with the starting, the Q output signal s turns to "L" level while The $\overline{Q}$ output signal turns to "H" level in the flip-flop 331. Although the first logic circuit 341 outputs a signal at "H" level by the $\overline{Q}$ output signal, since the output signal of the second logic circuit 342 does not change, the output signal v(w) of the flip-flop 343 does not invert.

During the state where the photoreceiving element 4 does not receive the pulse light, the counter 33 continues downward counting. However, at the instance the seventh shot of oscillation pulses is inputted from the pulse oscillator 1, the Q output signal s of the flip-flop turns to "L" level, and all of the output signals s, t, u of the flip-flops 331, 332, 333 turn to "L" level. As a result, the output signal of the second logic circuit 342 turns to "L" level and the output signals v(w) of the flip-flop 343 inverted. Upon receiving the signal at "L" level of the output signal v, the detection output circuit 8 externally transmits the output signal indicating that the detection output circuit 8 does not receive the pulse light.

Further, the output signal q of the second NOR circuit 392 turns to "H" level by the signal at "L" level of the output signal v. Accordingly, the counter 33 is forcedly reset. Furthermore, the counter 33 is switched to the up counter by the signal at "L" of the output signal v of the flip-flop 343.

In the three cases described above, the photoelectronic switch operates in the state quite free from the effects of the external disturbances. Explanation will then be made to the operation in the case where the photoelectronic switch suffers from the effects of the external disturbances. At first, explanation will be made to the case where the photoreceiving element 4 undergoes the effects of the external disturbances during continuous reception of the pulse light and elimination is resulted to a portion of the photo-reception signal c while referring to FIGS. 10 and 13.

As described above, in the state where the photoreceiving element 4 receives the pulse light, the Q output signal v is at "H" level while the $\overline{Q}$ output signal w is at "L" level in the flip-flop 343. Further, all of the output signals s, t, u of the respective flip-flops 331, 332, 333 for the counter 33 are at "H" level and, further, the output signal r of the first NOR circuit 391 is at "H" level, while the output signal q of the second NOR circuit 392 is at "L" level. Then, since the Q output signal v of the flip-flop 343 is at "H" level, the counter 33 is a down counter.

If elimination is resulted to the pulse light received so far, the output signal n of the waveform shaping circuit 60 at that portion maintains "H" level as shown in FIG. 13. Accordingly, the $\overline{Q}$ output signal o turns to "H" level, while the Q output signal p turns to "L" level in the latch circuit 7 of this portion. As a result, since the output signal r of the first NOR circuit 391 turns to "L" level, the counter 33 is released from the preset state. Upon releasing the preset, the counter 33 starts downward counting.

During the period in which the pulse light is eliminated, the counter 33 continues downward counting in synchronization with the oscillation pulses a. In this case, if at least one shot of pulse light is receives by the photoreceiving element 4 till the counter 33 counts the seventh oscillation pulses a, the output signals o, p of the latch circuit 7 are inverted. As a result, the output signal r of the first NOR circuit 391 turns to "H" level and the counter 33 is preset forcedly. Accordingly all of the Q output signals s, t, u of the flip-flops 331, 332, 333 are at "H" level to recover the state of continuously receiving the pulse light. Therefore, if the pulse light is eliminated due to the effects of the external disturbances, the counter 33 are preset forcedly to be free from the effects of the external disturbances unless seven or more pulse light are continuously eliminated.

Then, explanation will be made to the case where the photoreceiving element 4 does not receive the pulse light and external disturbing pulses are superimposed on the photo-reception signal of the photoreceiving element 4 due to the effects of the external disturbances while referring to FIGS. 10 and 14.

In the case where no pulse light is received, the Q output signal v is kept to "L" level, while the $\overline{Q}$ output signal w is kept to "H" level in the flip-flop 343. All of the Q output signals s, t, u for the respective flip-flops 331, 332, 333 of the counter 33 are at "L" level. Further, the output signal r of the first NOR circuit 391 is at "L", while the output signal q of the second NOR circuit 392 is at "H" level. The counter 33 functions as an upcounter by the signal at "L" level of the Q output signal v of the flip-flop 343.

Now assuming in this state that the photoreceiving element 4 receives the light of external disturbing pulses c' as shown at c' in FIG. 14, the external disturbing pulses c' are waveform-shaped into external disturbing pulse signals n'. The signals n' are transmitted to the latch circuit 7 and the latch circuit 7 inverts its output signal o, p. Therefore, the output signal q of the second NOR circuit 392 turns to "L" to release the reset state of the counter 33.

The counter 33 starts the upward counting for the oscillation pulses a. If the number of the continuously inputted external disturbing pulses c' is less than 7 in this case, the photoelectronic switch conducts the following operations.

That is, since the output signal n' of the waveform shaping circuit 60 maintains "H" level after receiving the light of the final external disturbing pulse c', the output signals o, p of the latch circuit 7 are inverted. Therefore, the output signal q of the second NOR circuit 392 turnes from "L" to "H" level. As a result the counter 33 is forcedly reset. Accordingly, the counter 33 is forcedly reset and is free from the effects of the external disturbances unless external disturbing pulses c' are received by more than 7 continuously.

As has been described above, when 7 or more pulse light are continuously received, the photoelectronic switch in this prior invention turns the Q output signal v of the flip-flop 343 to "H" level to output a detection signal indicating that the photoreceiving element 4 receives the light. While on the other hand, if 7 or more pulse light is continuously eliminated, it turns the output signal v of the flip-flop 343 to "L" level and outputs a detection signal indicating that the photoreceiving element 4 does not receive the light. Actually, it seldom occurs that 7 or more pulse light are eliminated continuously due to the effect of the external disturbances, or 7 or more of external disturbing pulse light are received continuously. Accordingly, there are no substantial effects of external disturbances.

However, the photoelectronic switch as described above involve the problems as described below.

That is, the photoelectronic switch can overcome the problems in the prior art of increasing the number of parts and the corresponding increase in the cost upon making the circuit components smaller and, particularly, attaining the integrated circuit for the photoelectronic switch, as well as the loss of the advantages for attaining the integrated circuit caused by the increased area of the integrated circuit itself, to some extent without reducing the functions at all. However, there is still present a problem that a number of parts are required for constituting the circuit.

BRIEF SUMMARY OF THE INVENTION

Accordingly, the objects of this invention is to provide a photoelectronic switch capable of eliminating the effects due to the external disturbing light and further making an improvement to the photoelectronic switch invented previously by the applicant to decrease the number of parts constituting the circuit, thereby facilitating the reduction in the size and attaining the integrated circuit, as well as reducing the cost.

These and other objects as well as features of this invention will be understood more specifically by considering the following explanations while referring to a preferred embodiment illustrated in the appended drawings.

BRIEF DESCRIPTION OF THE INVENTION

Figure 1:
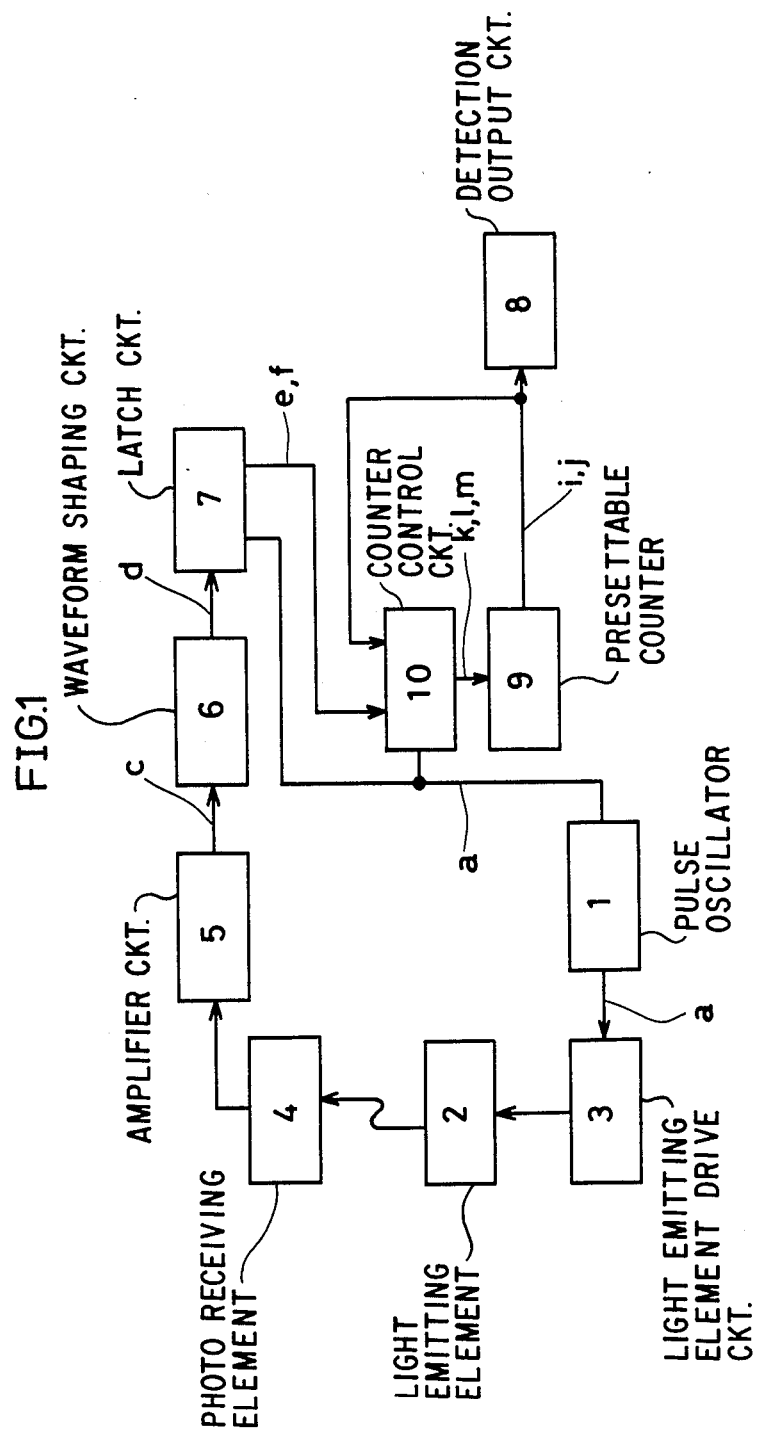
FIG. 1 is a block diagram for the circuit as one embodiment of the photoelectronic switch according to this invention.

1 . . . pulse oscillator; 2 . . . light emitting element
3 . . . light emitting element drive circuit
4 . . . photoreceiving element; 7 . . . latch circuit
9 . . . presettable counter; 10 . . . counter control circuit

DETAILED DESCRIPTION

This invention will now be described specifically referring to the following two embodiments. The portions identical with those in the photoelectronic switch described already regarding the prior art carry the same reference numerals for the simplification of the explanation. The first embodiment will be explained at first.

As shown in FIG. 1, the photoelectronic switch according to this invention has a circuit structure similar to that of the conventional photoelectronic switch as described above. Pulse oscillator 1, light emitting element 2, light emitting element drive circuit 3, photoreceiving element 4, amplifier circuit 5, latch circuit 7 and detection output circuit 8 are constitutional factors in common to them. The waveform shaping circuit 6 conducts waveform shaping for the photo-reception signal c by the method different from that in the conventional waveform shaping circuit 6. The presettable counter 9 receives the output signals k, l, m of the counter control circuit 10, outputs detection signal i, j whether the photoelectronic switch receives the pulse light or not and transmits the same to the detection output circuit 8. The counter control circuit 10 presets or resets the output signal i, j of the counter 9 in synchronization with the delay signal b (refer to FIG. 2) from the oscillation pulses a of the pulse oscillator 1 and based on the output signals e, f of the latch circuit 7 and the output signals i, j of the presettable counter 9.

Figure 2:
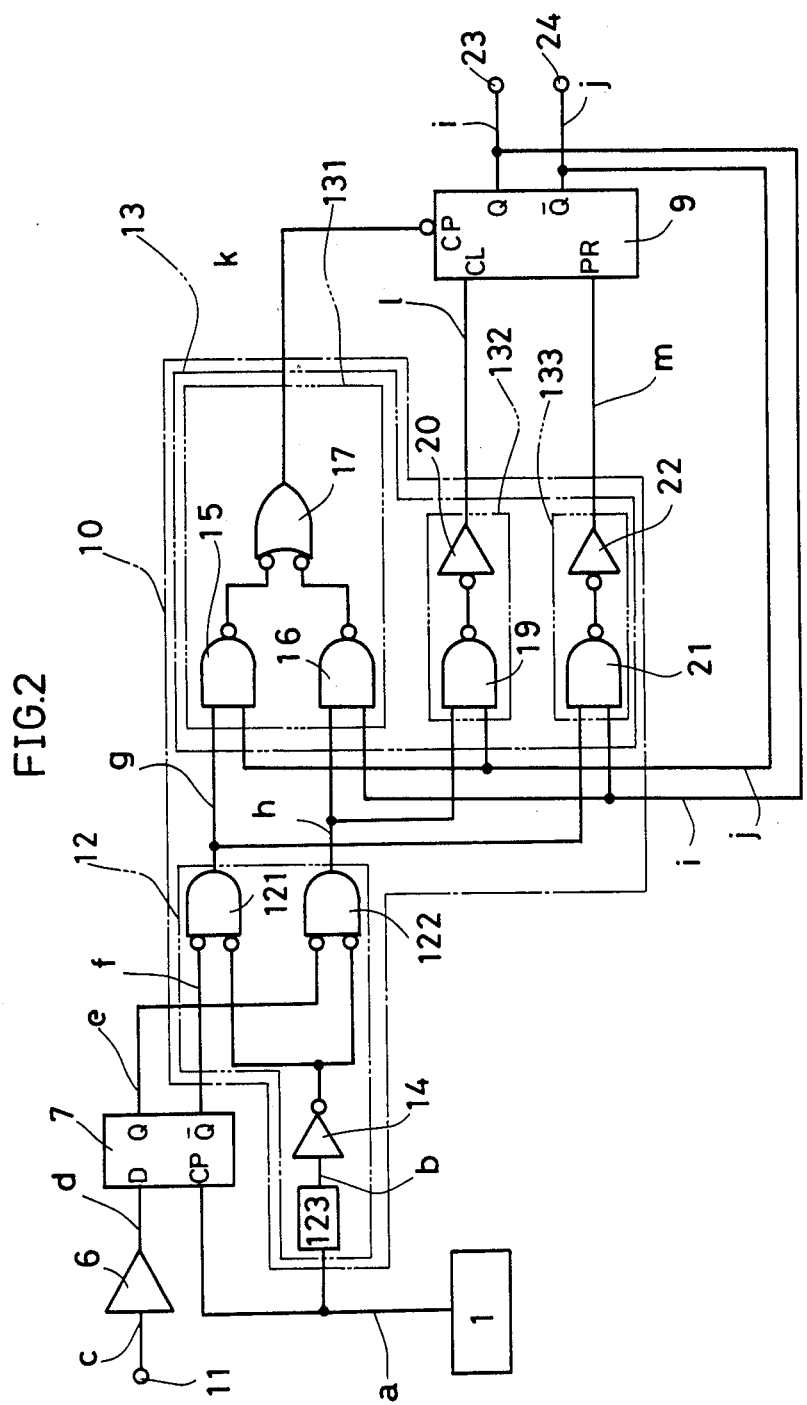
FIG. 2 is a specific circuit diagram for the embodiment.

Then, explanation will be made referring to FIG. 2 illustrating a specific embodiment of the circuit.

The photo-reception signal c amplified in the amplifier circuit 5 (refer to FIG. 1) is transmitted to the terminal 11. The photo-reception signal c is waveform-shaped in the waveform shaping circuit 6 and then transmitted as the output signal d to the latch circuit 7. The latch circuit 7 inputs the signal d to the D terminal, while inputs the oscillation pulses a of the pulse oscillator 1 to the CP terminal. Then, the latch circuit 7 outputs the $\overline{Q}$ output signal e and $\overline{Q}$ output signal f.

The counter control circuit 10 comprises a primary logic circuit 12 and a secondary logic circuit 13. The primary logic circuit 12 comprises two NOR gates 121, 122, a delay circuit 123 and an inverter 14. The NOR gate 121 is inputted with the $\overline{Q}$ output signal f of the latch circuit 7 and the delay signal b of the oscillation pulses a of the pulse oscillator 1 after being passed through the delay circuit 123 by way of the inverter 14. The NOR gate 122 is inputted with the delay signal b by way of the inverter 14 and the Q output signal e of the latch circuit 7.

The secondary logic circuit 13 comprises a first logic circuit 131, a second logic circuit 132 and a third logic circuit 133.

The first logic circuit 131 comprises a NAND gate 15 inputted with the output signal g of the NOR gate 121 and the $\overline{Q}$ output signal j of the presetable counter 9, a NAND gate 16 inputted with the output signal h of the NOR gate 122 and the Q output signal i of the counter 9 and a NAND gate 17 inputted with the output signals of the NAND gate 15 and the NAND gate 16.

Then, the second logic circuit 132 comprises a NAND gate 19 inputted with the output signal h of the NOR gate 122 and the $\overline{Q}$ output signal j of the counter 9 and an inverter 20 for inverting the output signal of the NAND gate 19.

Then, the third logic circuit 133 comprises a NAND gate 21 inputted with the output signal g of the AND gate 121 and the Q output signal i of the counter 9 and an inverter 22 for inverting the output signal of the NAND gate 21.

The output signal k of the first logic circuit 131 is inputted to the CP terminals of the presettable counter 9, the output signal l of the second logic circuit 132 is inputted to the CL terminal of the counter 9 and, further, the output signal m of the third logic circuit 133 is inputted to the PR terminal of the counter 9. The Q output signal i and the $\overline{Q}$ output signal j of the counter 9 are connected to terminals 23, 24, which are connected to the detection output circuit 8 not illustrated (refer to FIG. 1).

Figure 4:
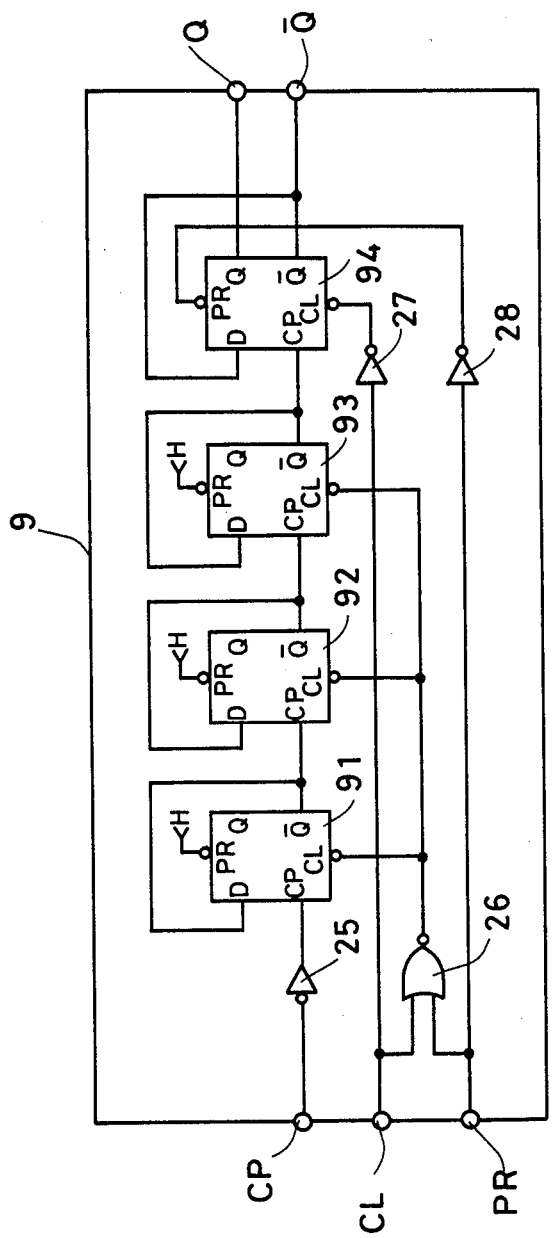
FIG. 4 is a specific circuit diagram for one embodiment of a presettable counter.

The presettable counter 9 is constituted as shown in FIG. 4. Four flip-flops 91, 92, 93, 94 are connected in series to form a 16-step counter. The output signal k of the first logic circuit 131 (refer to FIG. 2) inputted to the PR terminal of the counter 9 is inputted by way of the inverter 25 to the CP terminal of the flip-flop 91. The output signal l of the second logic circuit 132 inputted to the CL terminal of the counter 9 is inputted to the NOR gate 26 and also inputted to the CL terminal of the flip-flop 94 by way of the inverter 27. The output signal m of the third logic circuit 133 inputted to the PR terminal of the counter 9 is inputted to the NOR gate 26 and also inputted to the PR terminal of the flip-flop 94 by way of the inverter 28.

The output signal of the NOR gate 26 is inputted to each of the CL terminals of the flip-flops 91, 92, 93. The $\overline{Q}$ output signals of the flip-flops 91, 92, 93 are connected respectively to the CP terminals of the adjacent flip-flops 92, 93, 94 and also fed back to the respective D terminals. The PR terminals of the flip-flops 91, 92, 93 are always maintained at the state where signals at "H" level are inputted. The Q output signal i and the $\overline{Q}$ output signal j of the flip-flop 94 are transmitted to the detection output circuit 8 not illustrated (refer to FIG. 1).

Figure 3:
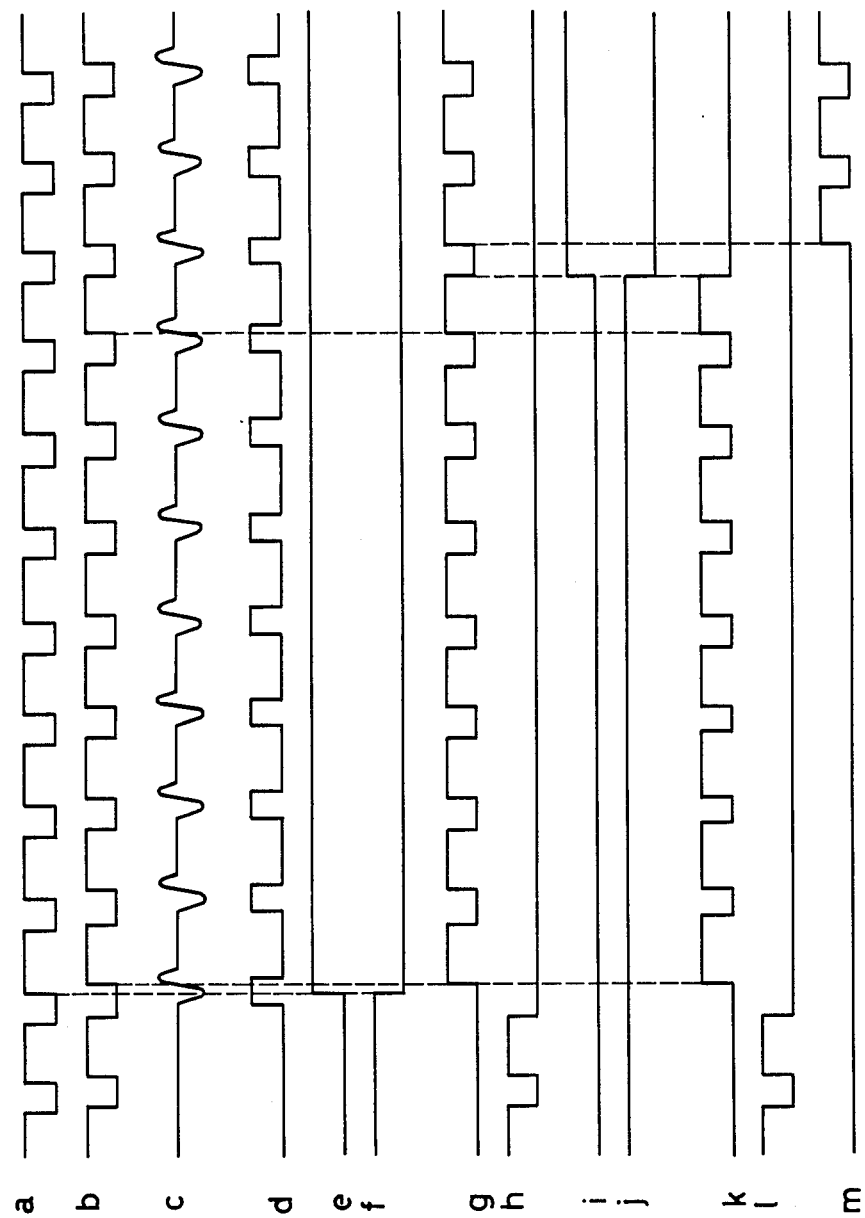
FIG. 3 is a operation waveform chart for each of the sections in the circuit where the photoelectronic switch receives a predetermined number of pulse light successively.

The operation of the photoelectronic switch according to this invention having such a circuit structure will now be described referring to FIG. 3, which is an operation waveform chart in each of the sections in the circuit.

At first, explanation will be made to the case where 8 or more of 8 shots of the pulse light are successively received in a state where no pulse light is received to the photoreceiving element 4 (refer to FIG. 1) as the first case. In this example, since the presettable counter 9 is constituted as a 16-step counter, a detection signal from the counter 9 is generated indicating whether the photoreceiving element 4 receives light or not by the successive 8 shots of pulses.

In a state where the pulse light is not received successively, the Q output signal i is at "L" level, while $\overline{Q}$ output signal j is at "H" level in the counter 9. Then, the photo-reception signal generated to the photoreceiving element 4 upon receiving the pulse light is amplified in the amplifier circuit 5 and then transmitted as the photo-reception signal c to the waveform shaping circuit 6 (refer to FIG. 2). The waveform-shaped photo-reception signal d is transmitted to the latch circuit 7. The latches circuit the photo-receptin signal d in synchronization with the pulses a of the pulse oscillator 1 and transmits the Q output signal e and the $\overline{Q}$ output signal F to the counter control circuit 10. In this case, the Q output signal e turns from "L" to "H" level, while the $\overline{Q}$ output signal f turns from "H" to "L" level.

Since the Q output signal e from the latch circuit 7 has turned to "H" level, the primary logic circuit 12 of the counter control circuit 10 starts the output of the pulse signal b in synchronization with the rising of the delay signal b after the oscillation pulses a have been delayed in the delay circuit 123. The pulse signal g is kept to be outputted during the reception of the pulse light to the photoreceiving element 4. Further, since the $\overline{Q}$ output signal f from the latch circuit 7 turns to "L" level, the primary logic circuit 12 maintains the pulse signal h at "L" level. That is, the primary logic circuit 12 outputs the pulse signal g when the photoreceiving element 4 receives the pulse light, while outputs the pulse signal h when it does not receive the pulse light.

The pulse signal g of the primary logic circuit 12 is inputted to the first logic circuit 131 of the secondary logic circuit 13. The output signal k of the first logic circuit 131 is started to be outputted in synchronization with the rising of the pulse signal g. Since the output signal k is inputted to the CP terminal of the counter 9, the counter 9 receiving the signal k starts counting. Then, when the 8th output signal k is inputted, the output signal i turns from "L" to "H" level, while the $\overline{Q}$ output signal j turns from "H" to "L" level in the counter 9 in synchronization with the fall of the pulse signal. Upon receiving the Q output signal i at "H" level, the detection output circuit 8 (refer to FIG. 1) externally transmits the detection signal indicating that the photoelectronic switch receives the pulse light.

The Q output signal i turned to "H" level is inputted to the third logic circuit 133 of the secondary logic circuit 13 (refer to FIG. 2). Upon receiving the signal i, the third logic circuit 133 starts to output the output signal n. Since the signal m is inputted to the PR terminal of the counter 9, it drives the counter 8 into a preset condition. Accordingly, if the photoreceiving element 4 keeps to receive the pulse light hereinafter, the counter 9 keeps to maintain the preset condition.

Figure 5:
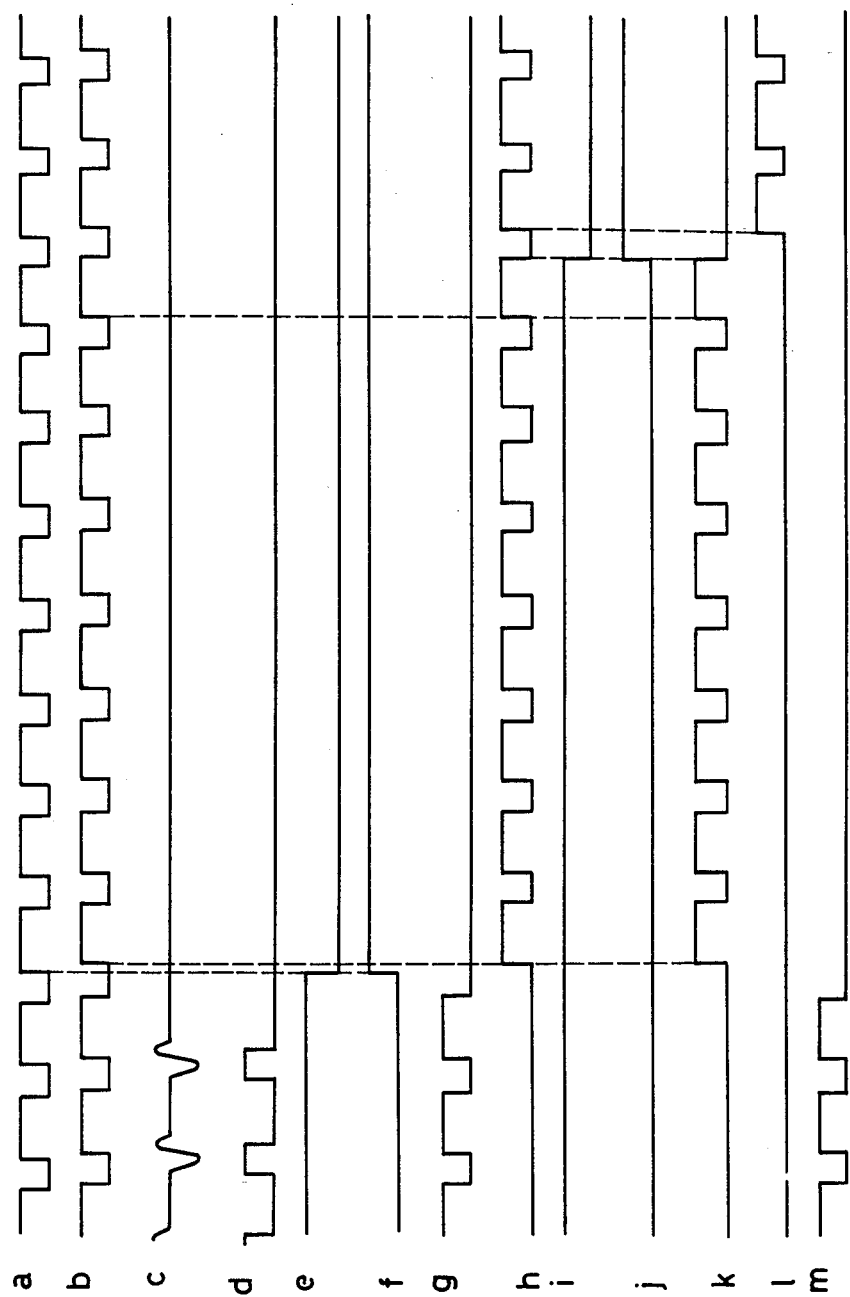
FIG. 5 is an operation waveform chart for each of the sections in the circuit where the photoelectronic switch does not receive the predetermined number of pulse light successively.

Then, explanation will be made to the case where 8 or more shots of pulse light are eliminated continuously in a state where the detection signal is externally transmitted indicating that the photoelectronic switch receives the pulse light while referring to FIG. 5 as the second case.

In a state where the pulse light is not successively received to the photoreceiving element 4, the Q output signal i is at "H" level, while the $\overline{Q}$ output signal j is at "L" level in the counter 9. Furthermore, the counter 9 is maintained under the preset condition. If the pulse light is eliminated in this case, the Q output signal e turns to "L", while the $\overline{Q}$ output signal f turns to "H" level in the latch circuit 7 in synchronization with the oscillation pulses a. Then, the output signal g from the primary logic circuit 12 maintains the "L" state and the output signal h is started to output. The preset condition of the counter 9 is released by the output signal h and the counter 9 starts counting.

At the instance the 8th pulse is counted, the Q output signal i turns to "L" level, while the $\overline{Q}$ output signal j turns to "H" level in the counter 9 in synchronization with the falling of the pulse. Upon receiving the thus inverted $\overline{Q}$ output signal j, the second logic circuit 132 of the secondary logic circuit 13 (refer to FIG. 2) starts to output the output signal I to the CL terminal of the counter 9 to render the counter 9 to a reset condition.

Accordingly, if the photoreceiving element 4 keeps the state of not receiving the pulse light thereafter, the counter 9 maintains the reset condition.

The foregoing operation of the photoelectronic switch is that under the state quite free from the effect of external disturbances. Explanation will be made to the operation under the state with the effect of the external disturbances.

Figure 6:
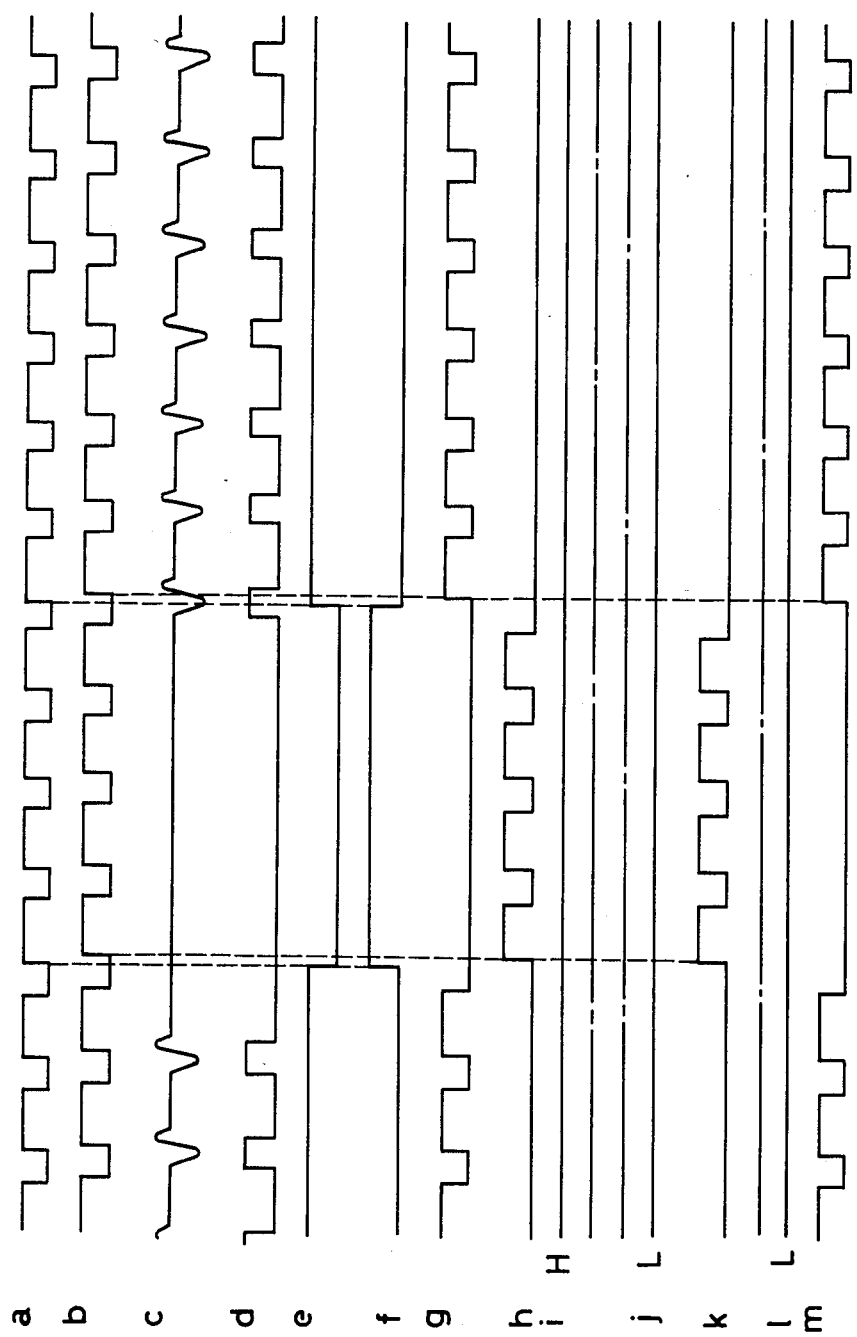
FIGS. 6 and 7 are operation waveform charts for each of the sections in the circuit subjected to the effects of the external disturbances.

At first, explanation will be made to the case where the photoreceiving element 4 undergoes the effect of the external disturbances during reception of successively shots of pulse light and its photo-reception signal c is partially eliminated, while referring to FIG. 6.

As has been described already, in the state where the photoreceiving element 4 receives the pulse light, the Q output signal i is at "H" level, while $\overline{Q}$ output signal j is at "L" level in the counter 9. Further, the counter 9 maintains the preset condition. In this case, if the pulse light is eliminated, the output signal d of the waveform shaping circuit 6 maintains "L" level. Accordingly, the Q output signal e turns to "L" level, while $\overline{Q}$ output signal f turns to "H" level at the latch circuit 7. Upon receiving the signals e, f, the counter 9 starts counting. In this case, if less than 8 shots of pulse light are eliminated, the output signals e, f of the latch circuit 7 are inverted when the pulse light is inputted to the photoreceiving element 4 again thereby returning the counter 9 to the preset condition. Accordingly, since the output signals i, j of the counter 9 are not inverted, it keeps to output a detection signal indicating that the photoelectronic switch receives the pulse light.

Figure 7:
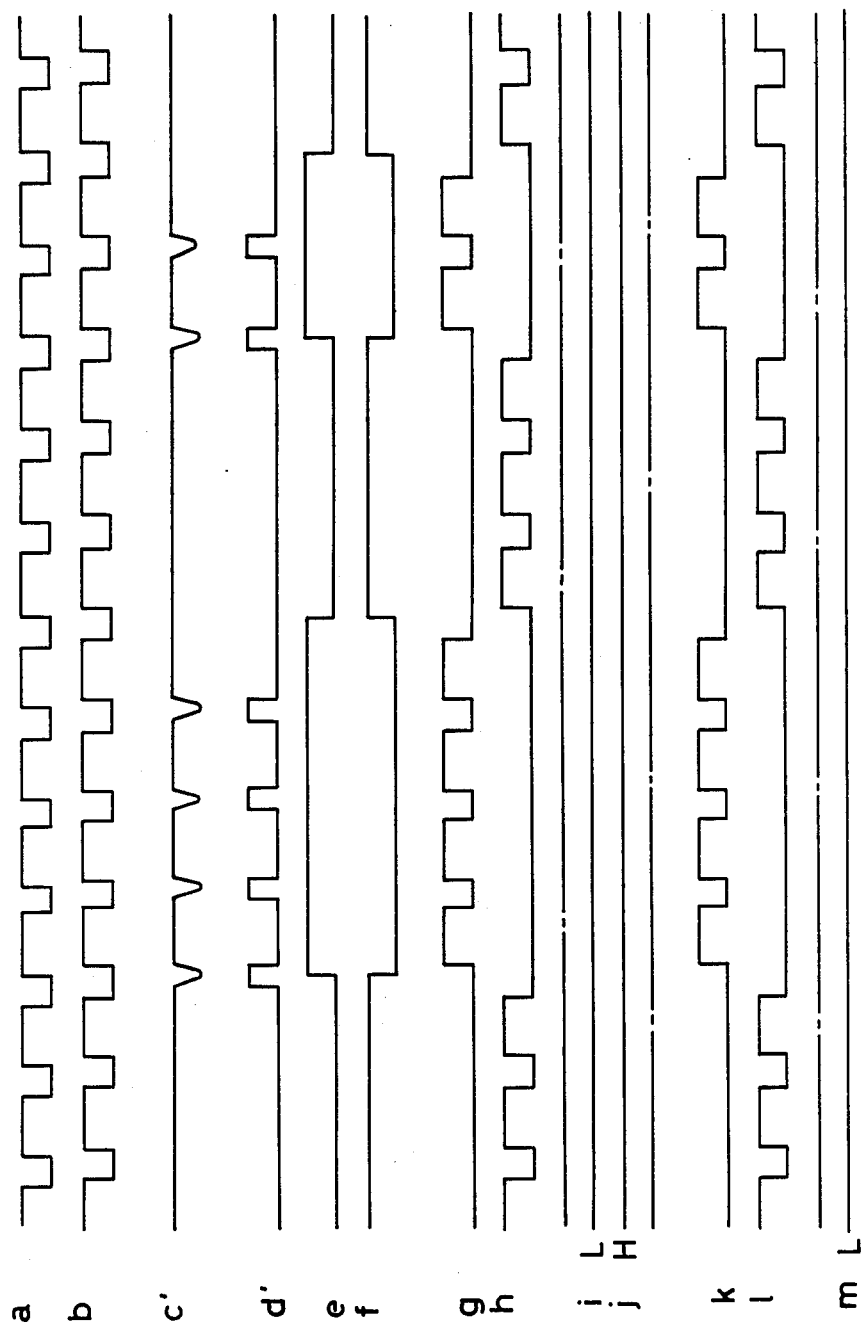

Then, explanation will be made to the case where external disturbance pulses are superimposed on the photoreception signal of the photoreceiving element 4 due to the effect of the external disturbances in the state where the photoreceiving element 4 does not receive the pulse light while referring to FIG. 7.

In the state where no pulse light is received, the Q output signal i is kept at "L" level, while the $\overline{Q}$ output signal j is kept at "H" level as described above. Further, the counter 9 maintains the reset condition. Assuming that the photoreceiving element 4 receives external disturbance pulse c' as shown by c' in the figure, the external disturbance pulse c' is waveform-shaped into an external disturbance pulse signal d'. The signal d' is transmitted to the latch circuit 7, which inverts the output signals e, f. Accordingly, the counter 9 is released from the reset condition and starts counting.

In this case, if the number of the external disturbance pulse c' is less than 8, the output signals g, h of the primary logic circuit 12 are inverted after the input of the final external disturbance pulse c' to return the counter 9 into the reset condition. Accordingly, since the output signals i, j of the counter 9 are not inverted in this case, the photoelectronic switch keeps to output a detection signal indicating that no pulse light is received.

Figure 8:
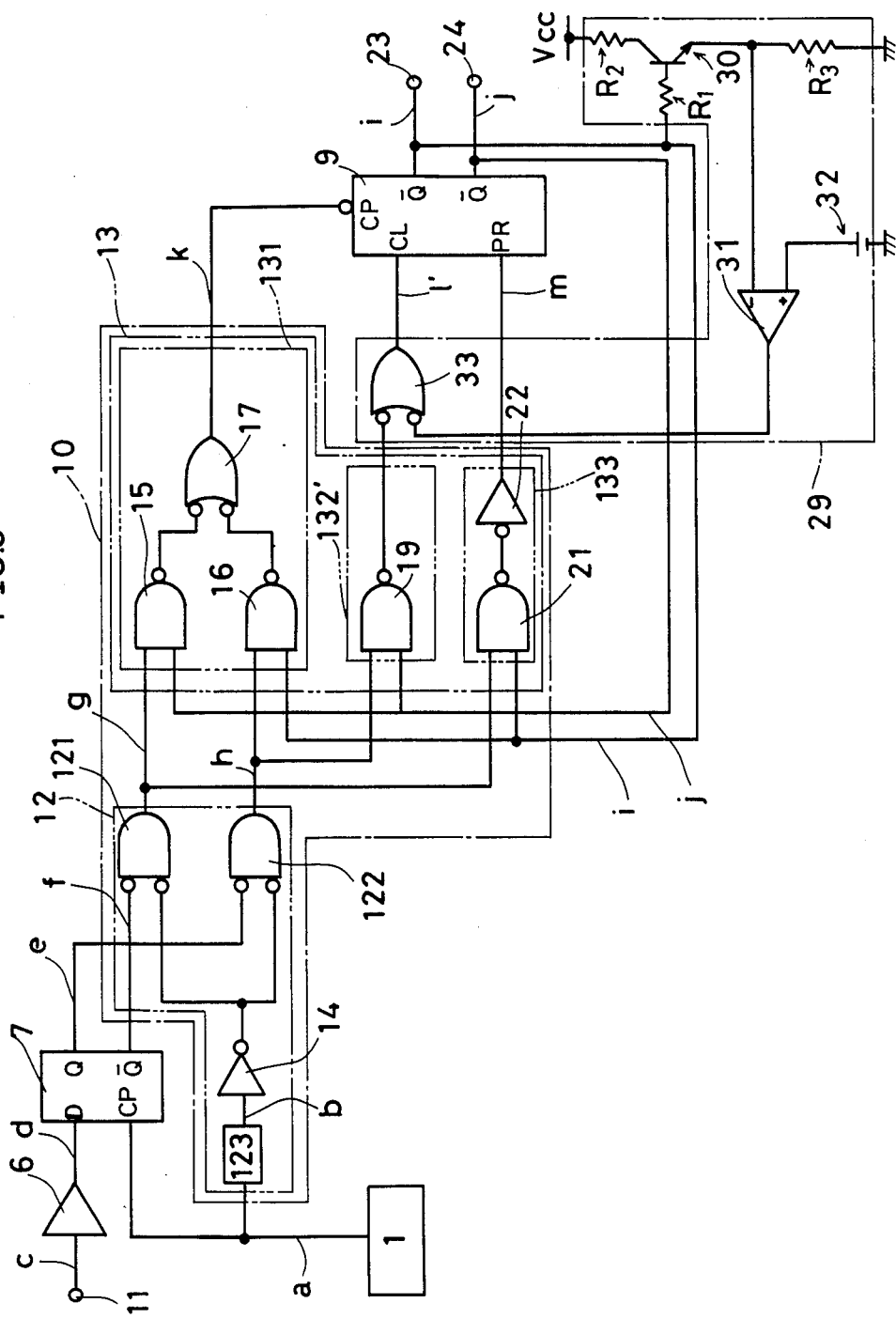
FIG. 8 is a circuit diagram for another embodiment in which an overcurrent protection circuit is provided.
Figure 9:
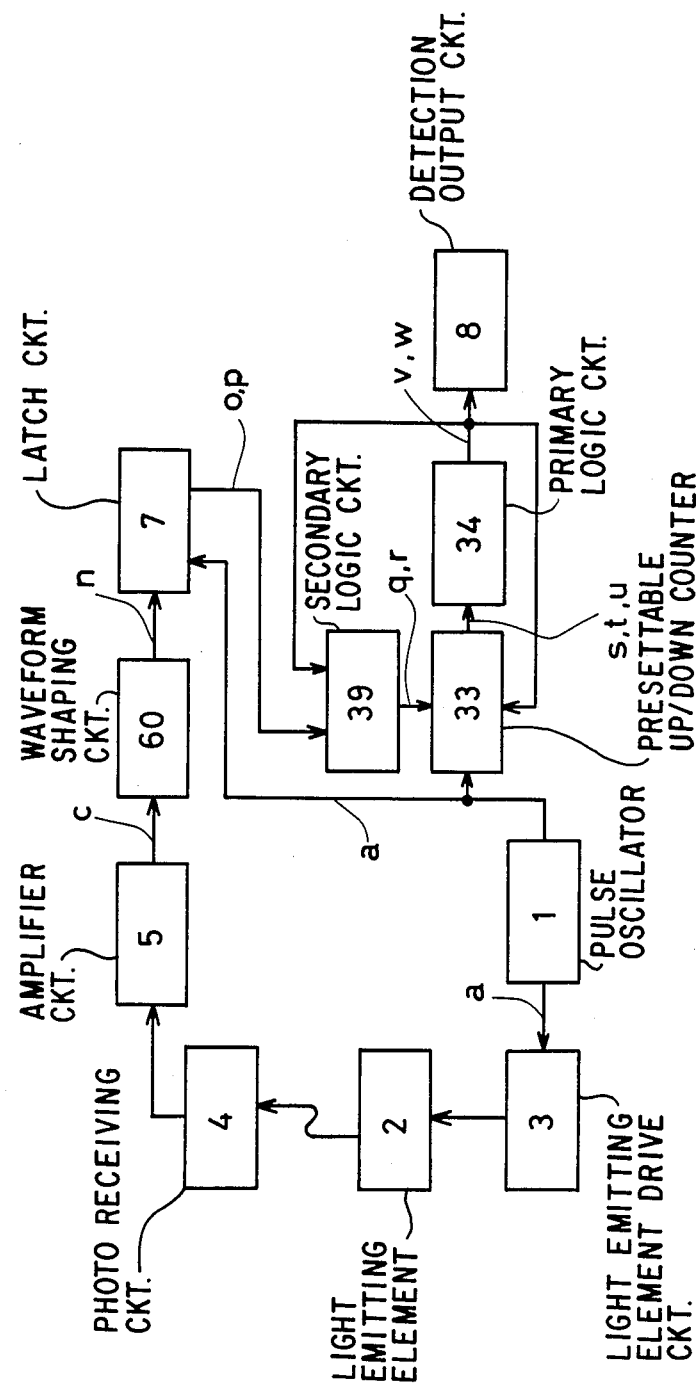
FIG. 9 is a block diagram for the circuit of a conventional photoelectronic switch.
Figure 10:
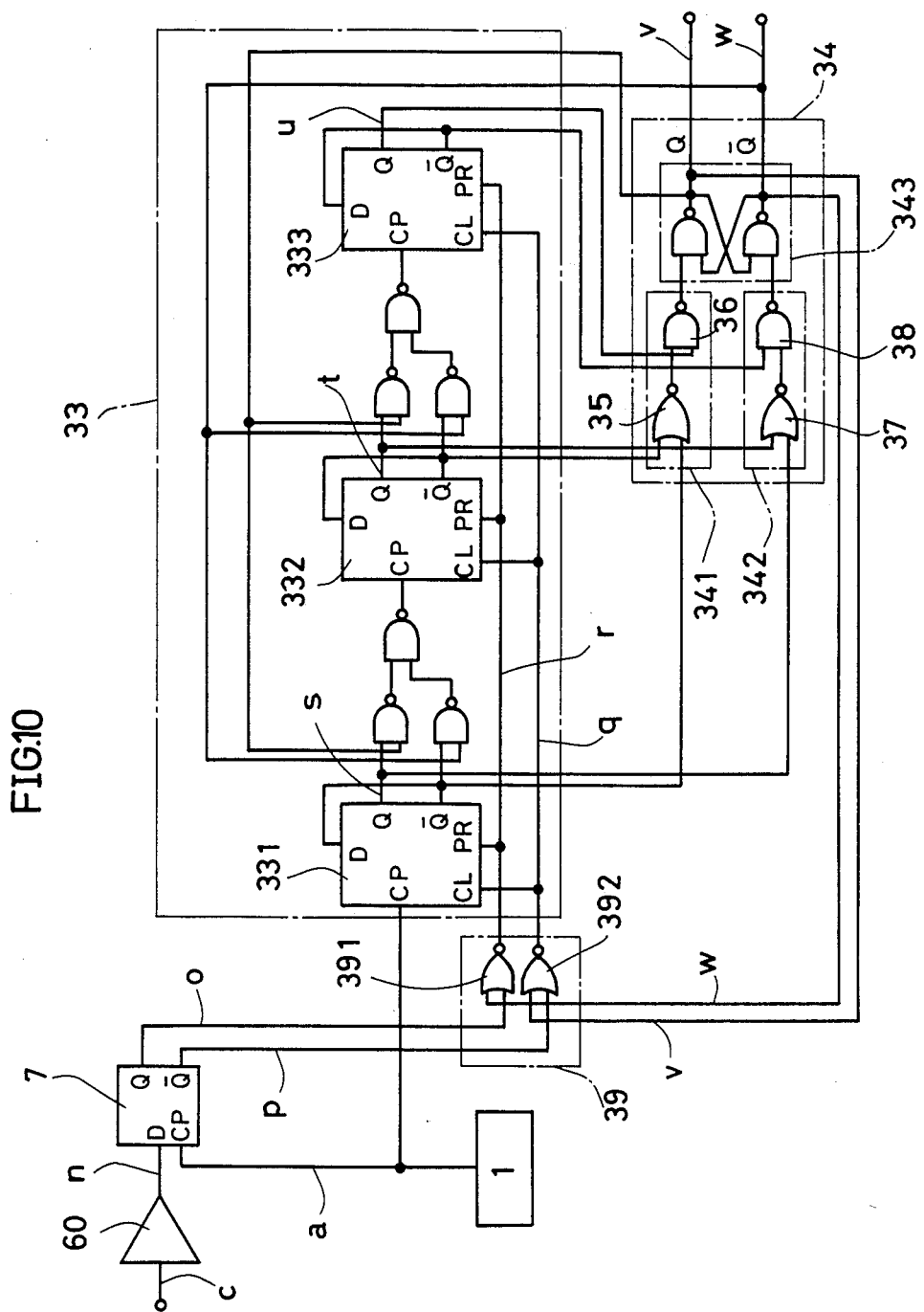
FIG. 10 is a specific circuit diagram for the photoelectronic switch.
Figure 11:
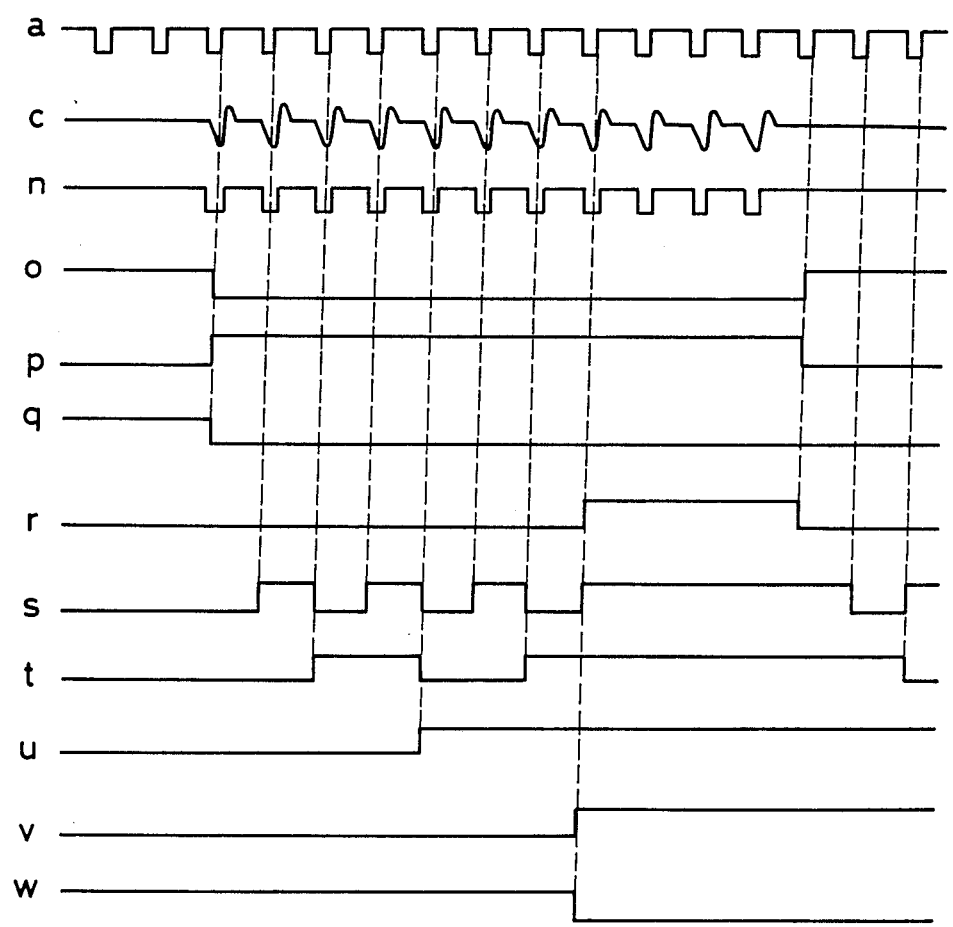
FIGS. 11 through 14 are operation waveform charts for each of the sections in the circuit of the photoelectronic switch.
Figure 12:
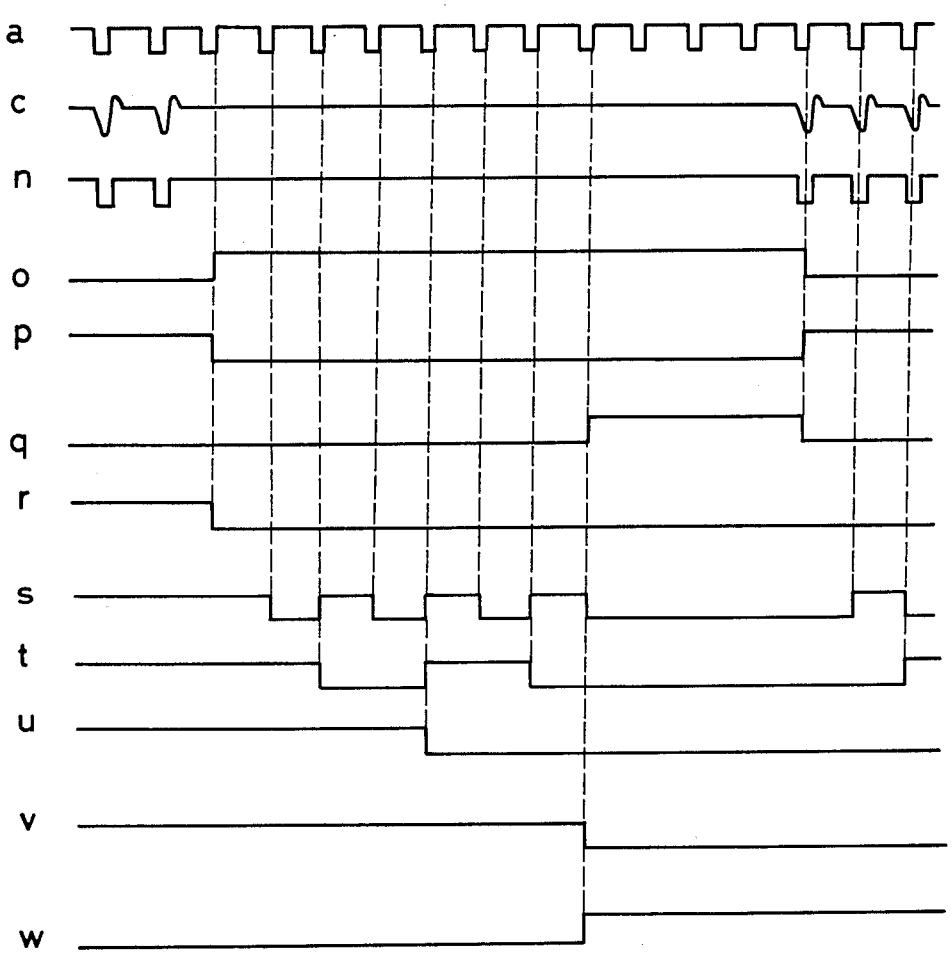
Figure 13:
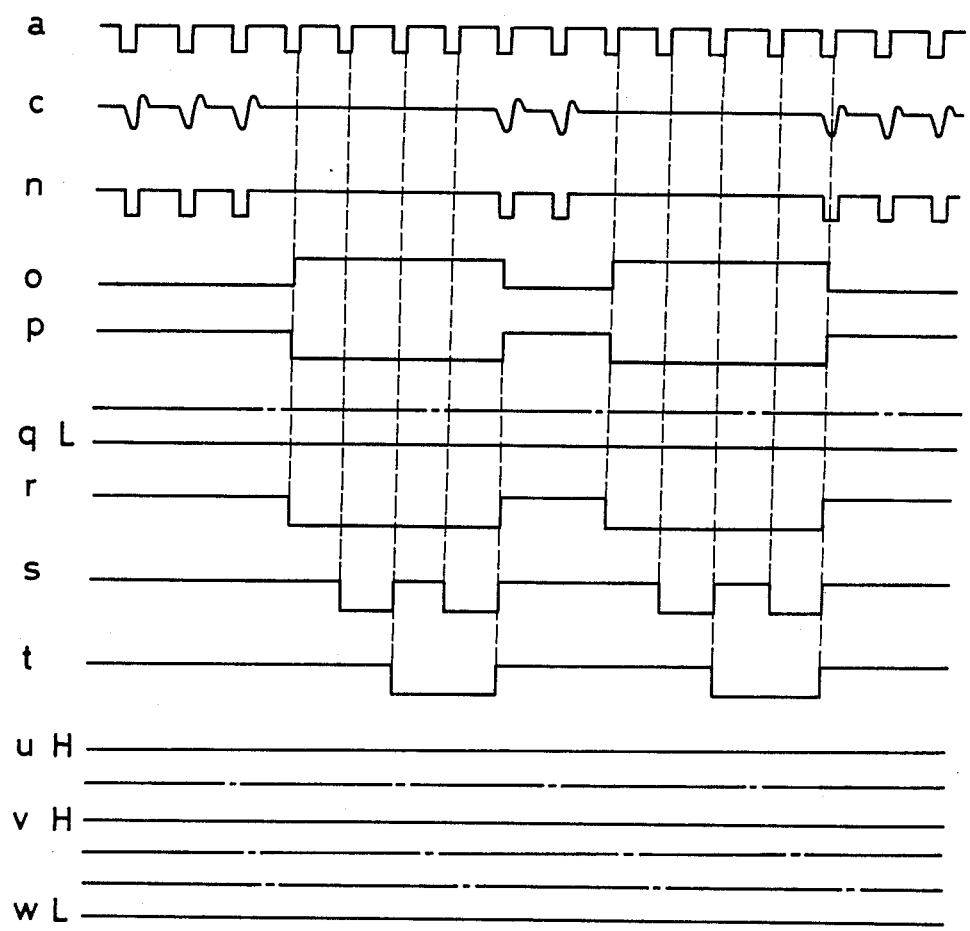
Figure 14:
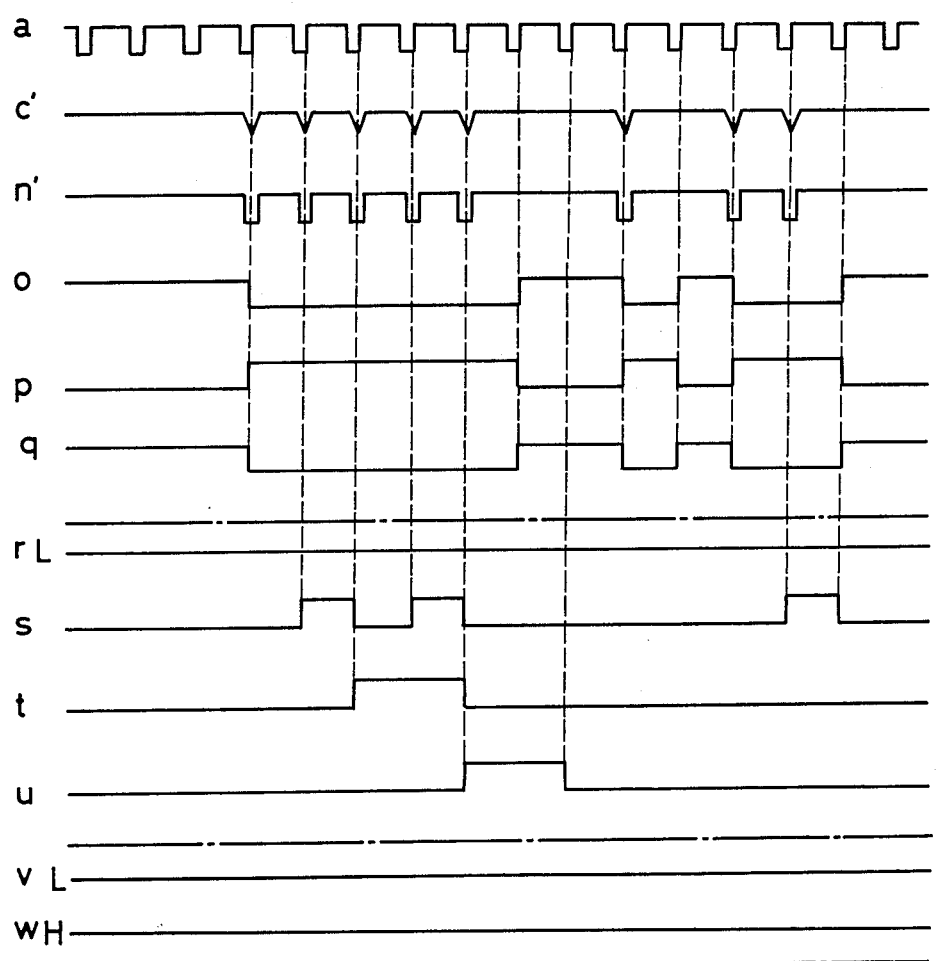

Then, explanation will be made to the second embodiment in which an overcurrent protection circuit is provided to the photoelectronic switch according to this invention while referring to FIG. 8. The portions identical with those in first embodiment described above carry the same reference numerals, for which the explanations are omitted.

The overcurrent protection circuit 29 has the following constitution. An output transistor is connected at the base thereof to the Q terminal of a presettable counter 9 by way of resistor R1. The collector of the transistor 30 is connected by way of resistor R2 to a power supply Vcc. Further, the emitter of the transistor 30 is grounded to the earth by way of register R3. The resistor R3 converts the output current flowing to the transistor 30 into a voltage. An input terminal on the negative side of a comparator 31 is connected between the transistor 30 and the resistor R3. Further, the input terminal on the positive side is connected to a reference voltage source 32.

The second logic circuit 132' of the secondary logic circuit 13 is composed only of NAND gate 19. NAND gate 33 inputted with the output signal from the NAND gate 19 and the output signal from the comparator 31 is disposed to the overcurrent protection circuit 29. The output signal I' of the NAND gate 33 is inputted to the CL terminal of the counter 9.

Explanation will now be made to the operation of the overcurrent protection circuit 29 having the foregoing constitution. Explanation is made for the state where the photoreceiving element 4 (refer to FIG. 1) receives pulse light and, therefore, the Q output signal i of the presettable counter 9 (refer to FIGS. 2 and 3) is at "H" level.

Since the Q output signal i of the counter 9 is at "H" level, the output transistor 30 is put to ON. If an overcurrent flows to the transistor 30 in this state, the emitter voltage of the transistor 30 goes higher than the reference voltage source 32 and the comparator 31 transmits an output signal at "L" level to the NAND gate 33. Accordingly, since the NAND gate 33 transmits, due to this signal, the output signal I' at "H" level to the CL terminal of the counter, the counter 9 is forcedly reset. As a result, since the output signals i, j of the counter 9 are inverted to render the Q output signal i to "L" level, the output transistor 30 is also turned OFF. Thereafter, when successive 8 shots of the pulse light are received, the output signals i, j of the counter 9 are again inverted to render the transistor 30 to ON. If the overcurrent flows in this state, the counter 9 is momentarily reset to repeat the foregoing operation.

The transistor 30 is put to ON in the foregoing operation over a brief period of time from the reception of successive 8 shots of pulse light till the resetting of the counter. The electric power consumed by the transistor 30 is equal to the integrated value for the electric power consumed within the brief period of time. Accordingly, the integration value can not actually exceed the allowable electric power for the transistor 30. Therefore, if an operator erroneously connects the collector of the transistor 30 directly to the power source without connecting the load, the transistor 30 is not damaged.

In these embodiments, the photoelectronic switch according to this invention outputs the detection output signal for the photo-reception or not photo-reception state depending on whether the 8 shots of pulse light are received or not. Accordingly, the operation periods for receiving and not receiving light are set identically. However, it is, of course, possible to set the operation times optionally depending on the number of flip-flops in the presettable counter 9, logical constitution for the output signals from the counter 9 and the oscillation frequency of the pulse oscillator 1 and the like.

Furthermore, although the presettable counter 8 is used as the counter in these embodiments, other counters such as presettable counter and up/down counter can of course be used.

As apparent from the foregoing explanations, according to this invention, the oscillation pulses of the pulse oscillator for driving the light emitting element are transmitted to the counter control circuit, which renders the output signal of the counter to the preset condition in a case where a predetermined number of shots or pulse light are successively received based on the signal formed by delaying the thus transmitted oscillation pulses and the photo-reception signal from the latch circuit latched to the oscillation pulses, to thereby externally transmit a detection signal indicating that the photoreceiving element receives the pulse light. Then, in the case where pulse light is not successively received, the control circuit renders the counter into the reset condition to thereby externally transmit a detection signal indicating that the photoreceiving element does not receive the pulse light. Accordingly, the output signal of the counter is not inverted unless the photoreceiving element receives a predetermined number of shots of pulse light successively. Therefore, the switch is less sensitive to the effect of the external disturbances.

Further, since the photoelectronic switch circuit is constituted in this invention without using reactance elements and reducing the number of parts employed, the circuit can be easily made smaller. Accordingly, it is suitable to attain the integrated circuit.

I claim:

1. A photoelectronic switch comprising:
    a pulse oscillator for outputting oscillation pulses at a predetermined frequency,
    a counter operatively connected to said pulse oscillator for counting the oscillation pulses,
    a light emitting element driven by said oscillation pulses and a photoreceiving element for receiving the light pulses issued from the light emitting element,
    a latch circuit operatively connected to said photoreceiving element and said pulse oscillator for latching a photo-reception signal from the photoreceiving element in synchronization with said oscillation pulses, and
    a counter control circuit means operatively connected to said counter and said latch for resetting said counter when the number of oscillation pulses counted by said counter during the operating state of said photoreceiving element as determined by said latch is less than a predetermined count value, and for presetting said counter when the number of oscillation pulses counted by said counter during the non-operating state of said photoreceiving element as determined by said latch is less than the predetermined count value.

2. The photoelectronic switch as defined in claim 1, wherein the counter is a 16-step presettable counter comprising four flip-flops.

3. The photoelectronic switch as defined in claim 1 or 2, wherein said counter control circuit means is synchronized with a signal formed by delaying the oscillation pulses.

4. The photoelectronic switch as defined in claim 3, wherein the switch comprises an overcurrent protection circuit for transmitting a signal to decrease the output current of the photoelectronic switch to the input for the counter when said current exceeds a predetermined value.

5. The photoelectronic switch as defined in claim 3, wherein the counter control circuit means comprises a primary logic circuit having first and second outputs, such that when the latch circuit outputs a signal, said first output outputs the delay signal and the second output outputs a constant low level signal.

6. The photoelectronic switch as defined in claim 5, wherein the counter control circuit means comprises a seondary logic circuit for outputting to the counter the delay signal output from said primary logic circuit until the counter counts a predetermined number of said delay signals.

7. The photoelectronic switch as defined in claim 5, wherein the signal for presetting the counter is a logical AND of the output of one of said first and second outputs of said primary logic circuit and one output signal from the counter, and the signal for resetting the counter is a logical AND of the output of the other of said first and second outputs of said primary logic circuit and the other output signal of said counter.

* * * * *